(12) United States Patent
Whittaker (10) Patent No.: US 7,348,847 B2
(45) Date of Patent: Mar. 25, 2008

(54) INTEGRATED IMPLEMENTATION OF A COLLECTOR BOOST SCHEME AND METHOD THEREFOR

(75) Inventor: Edward J. W. Whittaker, Bishop's Stortford (GB)

(73) Assignee: SiGe Semiconductor Inc., Ottawa, Ontario (CA)

( * ) Notice: Subject to any disclaimer, the term of this patent is extended or adjusted under 35 U.S.C. 154(b) by 70 days.

(21) Appl. No.: 11/116,204

(22) Filed: Apr. 28, 2005

(65) Prior Publication Data
US 2006/0244534 A1 Nov. 2, 2006

(51) Int. Cl.
*H03F 3/04* (2006.01)
(52) U.S. Cl. .................................... 330/250; 330/297
(58) Field of Classification Search .................. None
See application file for complete search history.

(56) References Cited

U.S. PATENT DOCUMENTS

| | | | |
|---|---|---|---|
| 6,437,641 B1 | 8/2002 | Bar-David | |
| 6,636,112 B1 | 10/2003 | McCune | |
| 6,661,212 B2 * | 12/2003 | Ostrom | 323/276 |
| 6,756,837 B2 * | 6/2004 | Kawai et al. | 327/536 |
| 6,831,519 B2 | 12/2004 | Bar-David | |
| 6,900,697 B1 * | 5/2005 | Doyle et al. | 330/297 |
| 7,057,461 B1 * | 6/2006 | Canilao et al. | 330/285 |
| 7,116,253 B2 * | 10/2006 | Norsworthy | 341/127 |

FOREIGN PATENT DOCUMENTS

| | | |
|---|---|---|
| WO | WO 01067598 A1 | 9/2001 |
| WO | WO 04008632 A1 | 1/2004 |

* cited by examiner

*Primary Examiner*—Robert Pascal
*Assistant Examiner*—Krista M Flanagan
(74) *Attorney, Agent, or Firm*—Townsend and Townsend and Crew LLP (57) ABSTRACT

A collector boost circuit is disclosed for providing a first voltage in a first mode of operation to a power amplifier, and a second voltage in a second mode of operation to the power amplifier. The collector boost circuit uses a switch and an indicator signal for triggering the switch between the first and the second mode of operation. The second voltage is a boosted voltage greater than the first voltage and is provided during peak excursions through a boost capacitor.

46 Claims, 10 Drawing Sheets

INTEGRATED IMPLEMENTATION OF A COLLECTOR BOOST SCHEME AND METHOD THEREFOR

FIELD OF THE INVENTION

The invention relates to amplifiers and more particularly to integrated power amplifiers.

BACKGROUND OF THE INVENTION

Frequency division multiplexing (FDM) is a technology for transmitting different data sets within each of multiple signals simultaneously over a single transmission path, such as a cable or wireless system. Each signal travels within a carrier—a unique frequency range that is modulated by data being transmitted.

Orthogonal frequency division multiplexing (OFDM) is a spread spectrum technique that distributes each data set of the different data sets over a large number of carriers that are spaced apart at predetermined frequencies. This spacing provides the "orthogonality" in this technique, which allows for demodulators that are responsive only to frequencies relating to a signal data set. The benefits of OFDM are high spectral efficiency, resiliency to RF interference, and lower multi-path distortion. OFDM is advantageous because in a typical terrestrial broadcasting scenario there are multipath-channels—transmitted signals arrive at a receiver using various paths of different length. Since multiple versions of a signal interfere one with another it becomes difficult to extract data being transmitted.

For amplifying an OFDM signal, an amplifier must support a range of pulse amplitudes from a first level of amplitude through a peak amplitude. Though support for peak amplitude is a requirement of OFDM standards, OFDM peak pulses come with such infrequency that designing an amplifier to support them, though required, increases the power consumption of the PA and adds a level of complexity and cost that is undesirable.

For example, it is known to improve power consumption of PAs by varying supply voltage with a DC-to-DC converter to be proportional to the amplitude of the transmitted signal as depicted in WO040086321. Lower collector voltages are used to achieve lower output powers and higher collector voltages are used to deal with higher amplitude portions of the signal to be transmitted. Assuming high efficiencies in the regulator, very low power consumption is realized at low modulation frequencies by switchmode techniques. As the frequency of the modulation is increased the difficulty of designing ever faster switchmode regulators becomes too great and linear amplification stages are needed and no efficiency gain results.

The regulator approach is Prior Art, an example of which is depicted in U.S. Pat. No. 685320, and is an effective way of increasing the PA efficiency, by varying the collector or drain voltage on the amplifying transistor and changing the load line of the PA. Linearity requirements, however, force the gain/phase response to be linear with voltage change, or that pre-distortion is applied.

Other variants on this theme attempt to use a very fast, envelope tracking power supply on the collector in combination with a variable base supply. The modulation amplitude is realized by varying the power supply voltage while the phase information is injected onto the RF signal. Envelope tracking requires an even more complex power supply than the DC-to-DC converter approach and has yet to be demonstrated in a practical fashion. Such a circuit is disclosed in U.S. Pat. No. 6,437,641 where an excess envelope sensor is used to detect peak voltages and in turn enhance the output voltage fed to the power amplifier.

Several RF systems containing power amplifiers have recurrent periods with large peak excursions and these peak excursions need to be handled, in order to improve the efficiency of these systems by ensuring linearity of the power amplifier. As discussed in WO 01/67598, in prior art applications, one method to handle signals with large peak-to-average ratios is to control the DC power supply to a power amplifier. For example, in this case, one set of voltage levels are supplied to the power amplifier when the instantaneous amplitude is below a desired level and another set of voltage levels is supplied when the instantaneous amplitude is above a desired level.

In prior art, U.S. Pat. No. 6,831,519 a circuit is disclosed for allowing a power amplifier to work under different operating power supply voltages, in response to different input signals. Specifically, circuitry is provided for controlling the level of the voltage supplied to a power amplifier, via supplementary supply path. In this circuit, two controllable impedances in the form of field-effect transistors as well as an inductor are provided, for when in operation with control pulses, directing the flow of current and providing enhancement voltage to the amplifier when necessary. However, the disadvantage of such a circuit is that it is not realizable within a low cost integrated power amplifier due to the difficulty in integrating the inductor and the PA on the same substrate.

It would be advantageous to provide a method and apparatus to improve the power output, efficiency, and distortion of an OFDM power amplifier without significantly increasing the power supply complexity, or needing a second voltage supply. Advantageously, improving these attributes is beneficial in WLAN systems in order to provide users with better data transmission range, longer intervals between battery charging, and more generally lower power consumption.

SUMMARY OF THE INVENTION

In accordance with the invention there is provided a circuit comprising: a boost capacitor; an amplifier voltage supply output port; a voltage supply input port for receiving a first voltage; an indicator signal input port for receiving an indicator signal; and, at least a switch responsive to the indicator signal for switching between a first mode of operation and a second other mode of operation, in the first mode of operation, the at least a switch for charging of the boost capacitor and for providing the first voltage to the amplifier voltage supply output port and in the second mode of operation the at least a switch for providing a boost voltage at the amplifier voltage supply output port in excess of the first voltage, the boost voltage resulting from a cooperation of the boost capacitor and the first voltage.

In accordance with the invention there is provided a method of improving linearity of a power amplifier comprising: amplifying an RF signal to provide an amplified RF signal comprising: providing an amplifier circuit including an amplifier voltage input port; in a first mode of operation, providing a first voltage potential to the amplifier voltage input port; in a second other mode of operation, providing a boosted voltage potential to the amplifier voltage input port, the boosted voltage potential formed by summing a first voltage potential from a voltage supply and a second voltage potential stored within a capacitor; and, switching from the first mode to the second mode in dependence upon a detected a presence of a peak pulse within the RF signal.

In accordance with the invention there is provided a storage medium having stored therein data, the data for when executed resulting in an amplifier design comprising a boost capacitor; an amplifier voltage supply output port; a voltage supply input port for receiving a first supply voltage; an indicator signal input port for receiving an indicator signal; at least a switch responsive to the indicator signal for switching between a first mode of operation and a second other mode of operation, in the first mode of operation, the at least a switch for charging of the boost capacitor and for providing the first voltage to the amplifier voltage supply output port and in the second mode of operation the at least a switch for providing a boost voltage at the amplifier voltage supply output port in excess of the first voltage, the boost voltage resulting from a cooperation of the boost capacitor and the first voltage.

BRIEF DESCRIPTION OF THE DRAWINGS

Exemplary embodiments of the invention will now be described in conjunction with the following drawings, in which.

DETAILED DESCRIPTION OF AN EMBODIMENT OF THE INVENTION

Figure 1A:
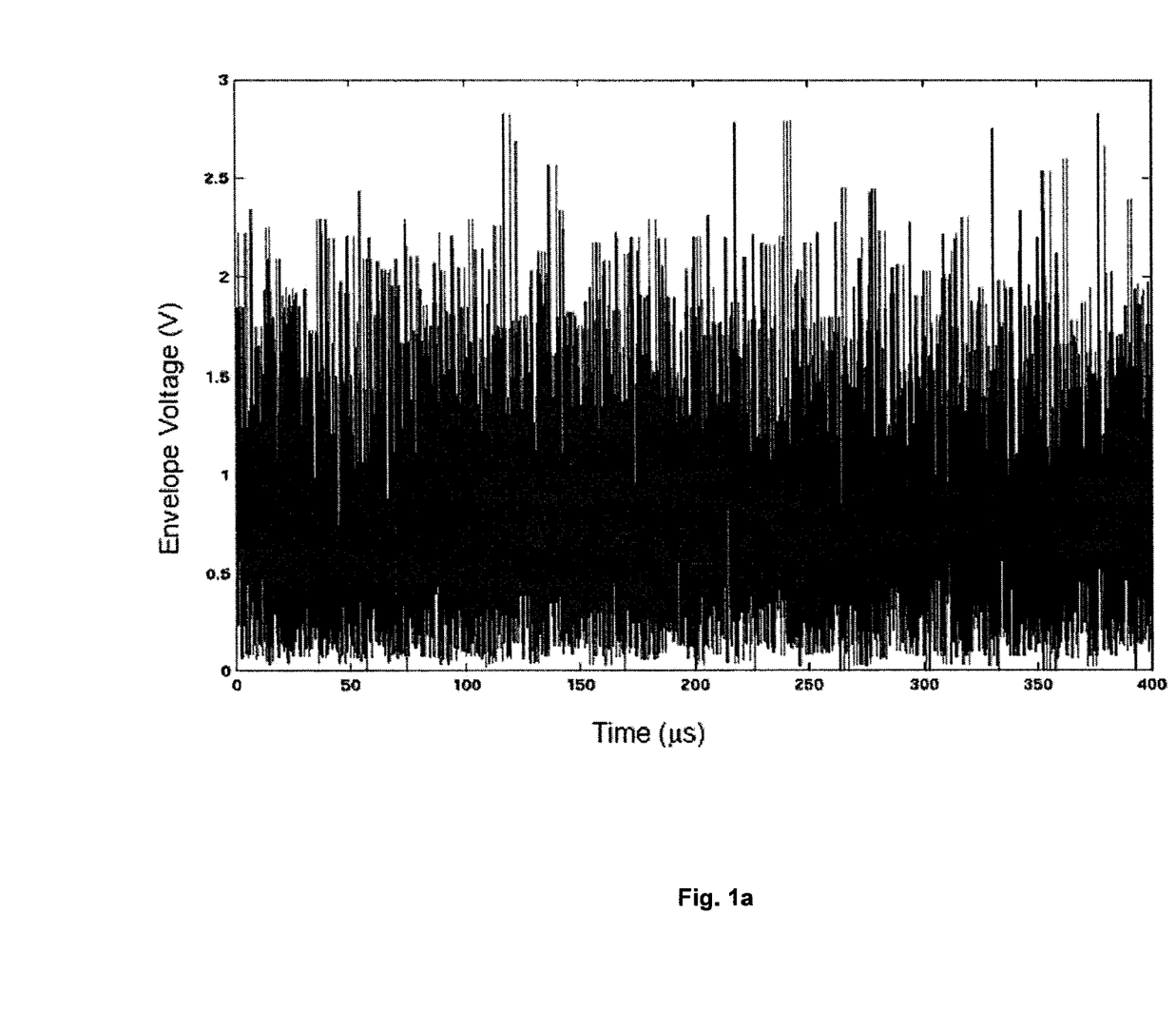
FIG. 1a illustrates a graph of linear RF output voltage versus time for 100 OFDM symbols.

Referring to FIG. 1a, a graph of linear RF output voltage versus time for 100 OFDM symbols is shown. The graph represents the magnitude of the RF envelope. In an ideal system, power used in the power amplifier (PA) would be at any instant proportional to the square of the RF voltage required. The peaks of the signal occur infrequently thus the mean output power of the PA is significantly below its peak output. So even in a class B amplifying stage where the current used is proportional to signal amplitude the constant dc collector supply voltage has to be toleranced to handle the peaks of the signal without amplifier clipping. This results in inefficiency when the amplifier is operating at lower power levels since there is unused voltage headroom available to the amplifier. If a lower supply voltage is used the amplifier distorts on the peaks and the information content of the OFDM signal may be jeopardised.

Current generation portable battery operated devices rely on advances in battery technology and on advances in low power circuit operation in order to enhance battery life, reduce circuit costs, and improve reliability. Unfortunately, even using class B operation results in inefficiency as noted above. To date most integrated solutions for OFDM PAs have relied on class B operation and as a result the efficiency of the PA under OFDM modulation has been constrained. Therefore either battery life, battery size or PA output power has suffered. The current invention demonstrates a method to improve the efficiency of an integrated PA under OFDM modulation thereby improving battery utilisation and reducing the heat dissipated in the PA.

Since peak pulses are statistically infrequent, operation of a PA in an inefficient mode for the sole purpose of supporting peak pulses is not ideal. Furthermore, failing to support peak pulses, and therefore failing to support proper OFDM operation, is also not ideal.

Figure 1B:
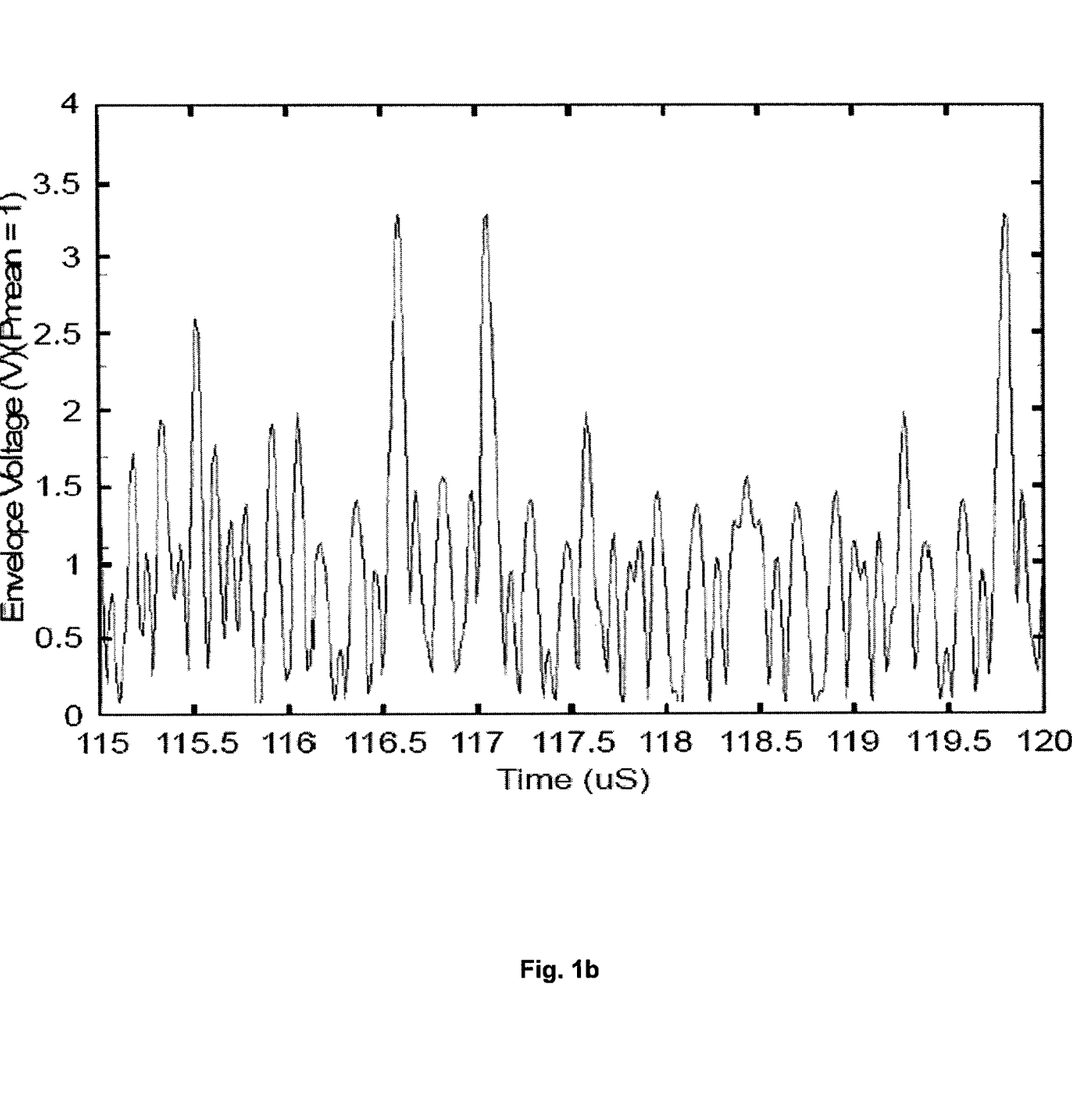
FIG. 1b illustrates a graphical representation depicting envelope voltage versus time of a peak pulse.

Referring to FIG. 1b, a graphical representation of peak pulse is shown. The peak pulses are infrequent and of limited duration.

To extend the prior art class B amplifier operation according to the invention, the collector voltage of the PA is boosted for supporting peak pulses.

Figure 2:
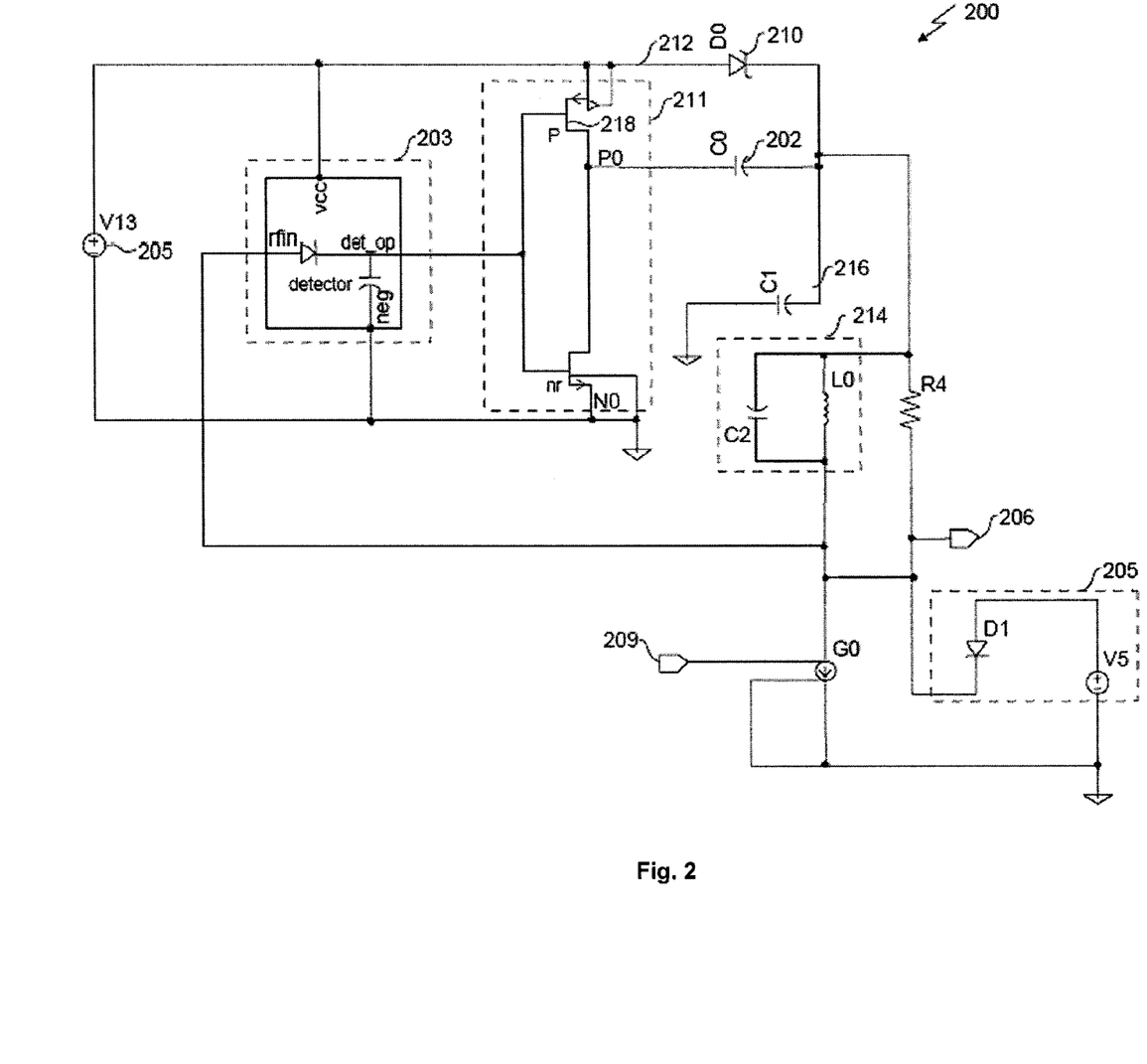
FIG. 2 illustrates a simple diagram of a collector boost circuit for boosting the collector voltage of a bipolar transistor to a predetermined range.

Referring to FIG. 2, shown is a simple diagram of a collector boost circuit for boosting the collector voltage of a bipolar transistor to a predetermined range when desired, according to an embodiment of the invention. Typically, boosting the collector voltage is required to overcome the clipping due to a low supply voltage and to accommodate large pulses. In operation, the collector boost circuit 200 senses the voltage just before the power amplifier operating in Class B operation, is about to clip and provides a boosted voltage to avoid distortion. The boosted voltage is approximately twice the voltage provided by voltage supply 205.

The collector boost circuit 200 comprises a detector circuit 203 coupled to power buffer 211 that are triggered by the detector circuit 203, which senses the voltage level of the output stage. Coupled to the power PFET buffer 218 is a power Schottky diode 210 for operating during unboosted voltage operation. Further coupled to the power PFET buffer 218 and the power Schottky diode 210 is an off chip boost capacitor 202.

The collector boost circuit 200 further comprises a voltage source 205 to supply voltage to the power amplifier and boost circuit 200, a collector tank circuit 204 having an inductor in parallel with a capacitor wired to a Vcc power rail, a distorting clamp diode and voltage source 207 for simulating NPN saturation by preventing the RF output from dropping below a predetermined reference voltage, an RF input port 209 and an RF output port 206.

For example, the voltage source 205 is a 3.3 V supply and compatible with 3.3V SiGe BiCMOS technology. The ideal current source, distorting clamp diode and voltage source 207, is used to model an NPN bipolar transistor RF amplifier and its operation into saturation. Since, in this collector boost circuit, the voltage on the collector terminal of the bipolar transistor is boosted, it is necessary to consider the limitation of the transistor causing it to go into avalanche. It is advantageous that the collector boost circuit 207 shown here, allows enough boost to ensure linearity of the power amplifier but does not drive the bipolar transistor into avalanche.

In unboosted operation, the power amplifier is fed from the power Schottky diode 210. In boosted operation, when the detector 203 senses a signal at the RF output port 206 and compares it against a threshold, it generates a CMOS drive signal to drive the power PFET buffer 218. The power PFET buffer 218 is for providing the boost voltage using the off chip boost capacitor 202. In boosted operation according to the present example, the output of the power buffer 211 goes from 0V to 3.3 V thereby almost instantaneously boosting the voltage on the collector tank circuit 204 from 3.3 V to 6.6 V. Once the boost operation is no longer required, the boosted voltage slowly decays through the capacitor 216 and the recovery is further provided by the Schottky diode 210 turning on again.

Figure 3A:
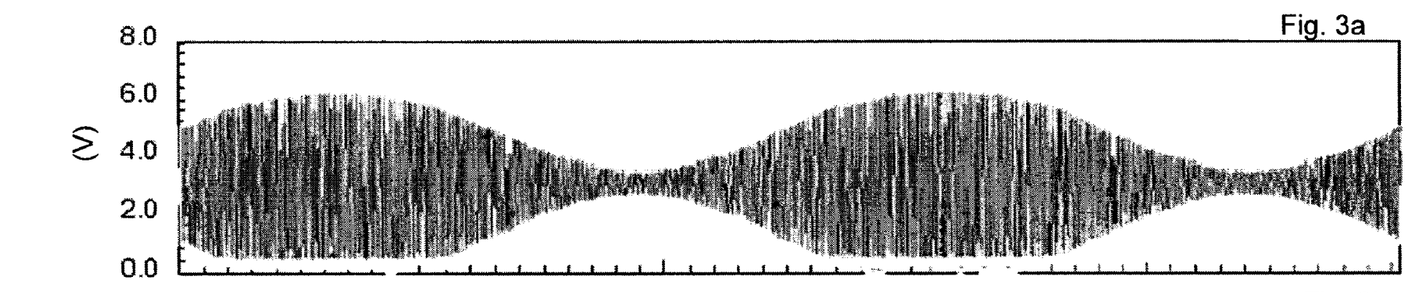
FIGS. 3a, 3b, 3c show the simulation results comparing the collector boost circuit 200 in operation and other than in operation.
Figure 3B:
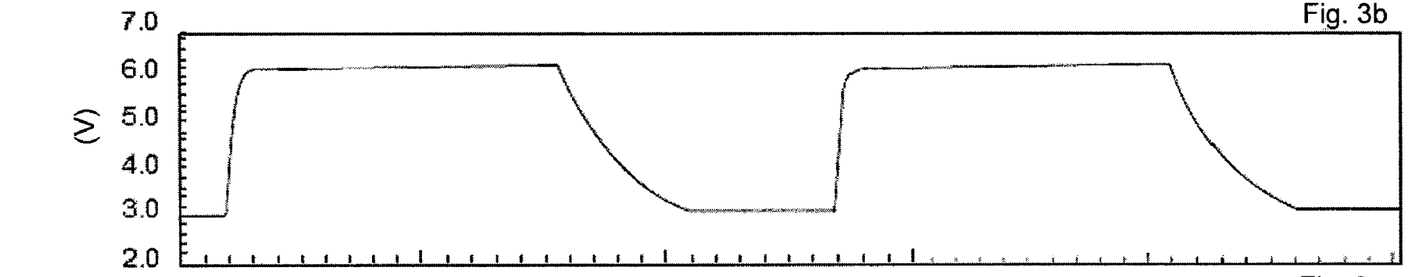
Figure 3C:
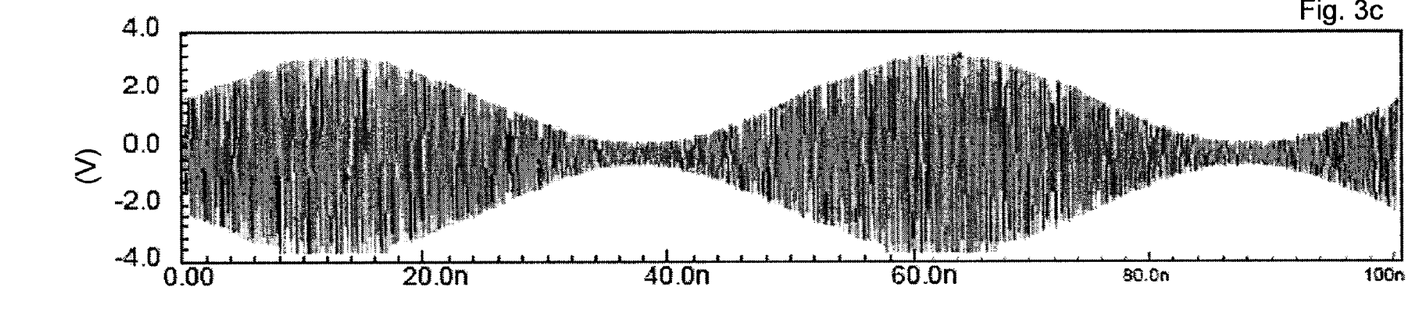

FIGS. 3a, 3b, 3c show the simulation results comparing the collector boost circuit 200 in operation and other than in operation. Specifically, FIG. 3a shows the collector voltage at the RF output port 206 without a collector boost circuit. As is evident from the graph clipping of the output signal occurs when the peak-to-peak voltage is outside of a predetermined range. Since there exists a distorting clamp diode and voltage source 207 in the collector boost circuit 200 at the output stage of the collector boost circuit, the output voltage is limited such that the voltage may not drop below approximately 400 mV as shown in FIG. 3a using a 2.5 GHz sine wave modulated by a 20 MHz carrier as an example. This is very typical of the saturation characteristic of an RF power NPN device. FIGS. 3b and 3c show the effect of the collector boost circuit in operation once the detector circuit 203 senses that the voltage at the RF output port 206 has dropped below a reference point. In the example shown here, the detector reference voltage has been set to cause the detector to trigger before the output stage saturates to allow for the finite switch speed of the detector and boost circuit. Specifically, FIG. 3b shows the boosting of the power rail voltage Vcc to Vcc3boost shown as 212. Here, the voltage increases from 3 V to 6 Volts in response to the voltage dropping below the reference point.

FIG. 3c shows the voltage across the collector tank circuit 204 in boosted operation. Clearly, the distortion that occurred in FIG. 3a due to the low voltage no longer occurs.

Figure 4:
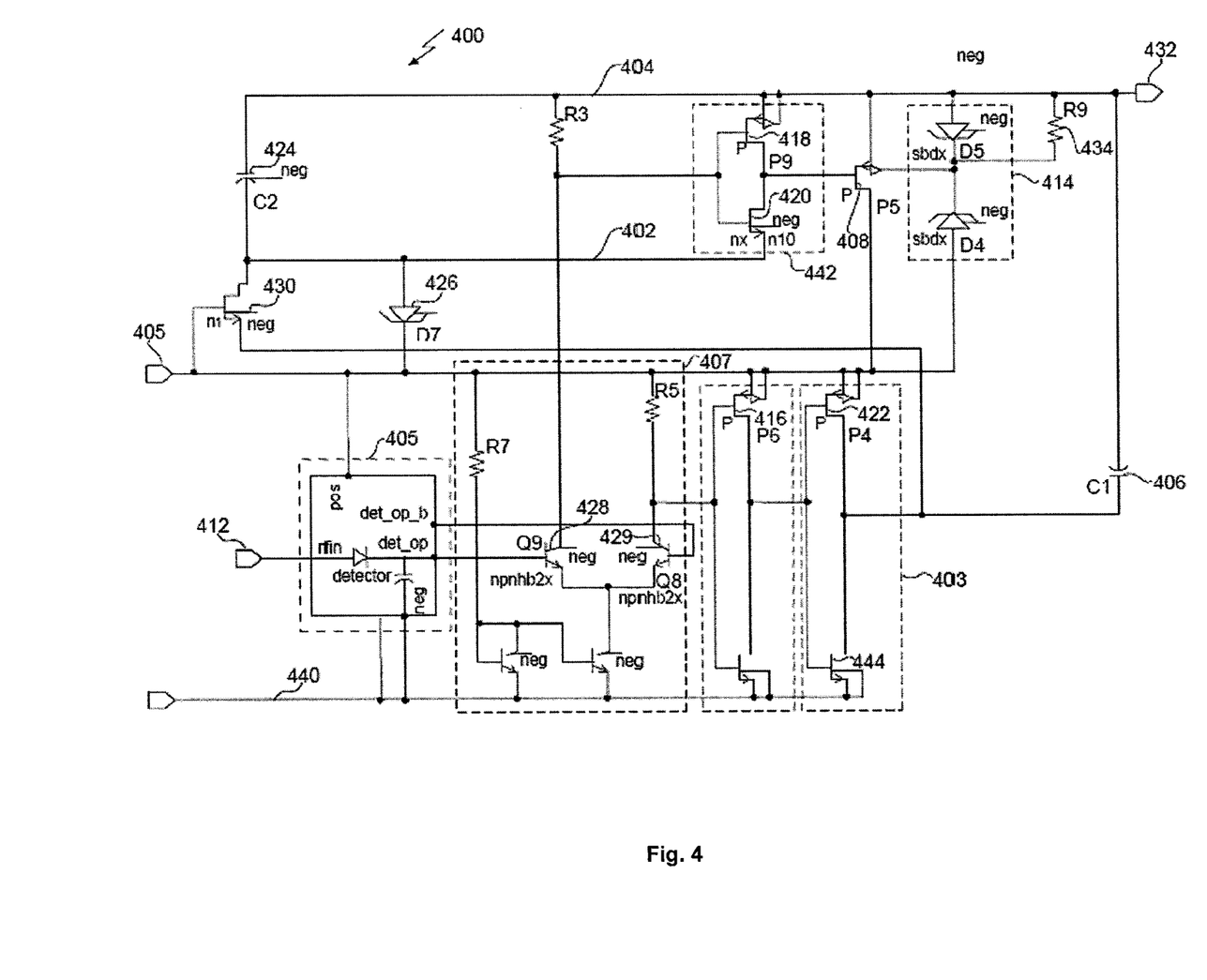
FIG. 4 shows the collector boost circuit according to another embodiment of the invention.

FIG. 4 shows the collector boost circuit according to another embodiment of the invention. Here, the collector boost circuit 400 is a complete integrated solution and comprises a PFET clamp 408, and two low-powered Schottky diodes 414 to replace the on-chip high-powered Schottky diode 210 shown in FIG. 2. This implementation is better suited for integration as high-powered Schottky diodes are not easily implemented with semiconductor processes. Further, on chip high current Schottky diodes need significantly more die area compared to a PFET clamp and its drive circuits. Advantageously, the use of a large PFET clamp 408 results in a lower cost solution with greater integration. Further advantageously, there is improved efficiency since the 'on' resistance of a PFET clamp 408 is arranged to give a lower voltage loss than the forward voltage drop across a Schottky diode.

At any instant in time, the source or drain of the PFET clamp 408 is variably more positive in magnitude and since it is preferably ensured that neither the source nor the drain of the PFET clamp 408 form a parasitic PNP transistor, therefore, a bias of the bulk of the PFET clamp transistor 408 is provided through the use of the two Schottky diodes 414 coupled to the PFET clamp 408. In operation, the Schottky diodes 414 turn on and conduct before the parasitic PNP transistors of 408. Further, coupled to the two Schottky diodes 414 is a resistor 434 for discharging the bulk of the PFET clamp if it is being 'pumped up' in potential by noise and signal spikes.

Similar to FIG. 2, the collector boost circuit further comprises power buffer 403. comprising NFET 444 and a power PFET buffer 422, to drive the external boost capacitor 406. In addition, there exists a current-mode logic (CML) stage circuit 407 coupled to the detector circuit 405 comprising a plurality of transistors that convert the output of the detector circuit 405 to CMOS output levels and provide output signal levels referenced to Vcc 409 and output signal levels referenced to the floating power supply labeled as "boosted Vcc3" 404.

The CML stage circuit 407 further comprises a bipolar differential pair 428 and 429 for performing the level shift from the detector circuit 405 output port to the buffer stage 416 comprising transistors 418 and 420 which drives the power buffer 403 and provides an antiphase and level shifted signal to drive a buffer 442 comprising of transistors 418 and 420, which drive the PFET clamp 408.

The power rails Vcc 409 and Neg 440 are effectively the same as the power supply voltage 203 shown in FIG. 2. Further, the detector circuit 405 senses the voltage provided by the RF input port 412, which is provided from the collector terminal of the amplifying transistor at the third stage of a power amplifier and detects potential saturation. In this manner, sensing the overload of the power amplifier is performed at the third stage of the power amplifier. This technique is advantageous as the sensed signal does not require any amplification and is large enough to drive the detector circuit 405. Further advantageously, by sensing the voltage at the output port of the third stage this scheme detects when the voltage swing is excessive when there is a danger of overload and provides a collector boost in response thereto. In this manner, the collector boost circuit 400 is insensitive to variations in overall power amplifier gain and less sensitive to variation in voltage standing wave ratio (VSWR) mismatch thereby eliminating the need for calibration as required by other techniques sensitive to VSWR.

Optionally, the detector circuit 405 is sensitive to variations in the voltage Vcc 409, such that the trigger point of the detector varies with Vcc thereby tracking the linear signal handling of the RF power amplifier with Vcc variation. Further optionally, the detector circuit 405 is sensitive to temperature variations such that the trigger point of the detector varies with temperature thereby tracking the linear signal handling of the RF power amplifier with temperature variations.

Further optionally, the trigger point or the threshold level at which the detector circuit 405 is triggered, is set to trigger at an earlier point before the overload of the amplifier occurs such that the collector voltage is boosted before the overload builds up. An approximately optimum threshold is determined such that the collector boost circuit is not triggered so often that efficiency is reduced yet sufficiently early such that distortion is avoided.

During boosted operation, the floating power supply 404 is boosted from 3.3 V to 6.6V and the floating negative power rail 402 is varied between 0V and 3.3V such that the voltage is 3.3V with respect to boosted output voltage 432. In this manner, it is ensured that the supply voltage across the transistors 418, and 420 remains approximately 3.3V.

The floating power supply 404 further provides the required signal to drive the PFET clamp transistor 408. Further, the transistors 408 and 422 are large PFETs and provide a low 'on' resistance necessary for the power supply efficiency. As a result of their size, the gate capacitance of the PFETs 408 and 422 is also large and the peak current to the gate is in the range of tens of mA. Since it is advantageous for the floating power supply 404 to provide a high peak current, a floating power rail capacitor 424 is provided and set to approximately 5 times the gate capacitance of the PFET clamp 408. The floating power rail capacitor 424 also filters out the noise of the circuit and ensures that the supply voltage remains relatively stable.

Coupled to the floating power rail capacitor 424 is an NFET transistor 430 for recharging the capacitor 424 during normal operation. While during boost operation, a Schottky diode 426 coupled to the floating power rail capacitor 424 and the NFET transistor 430 provides a simple recharge mechanism.

Figure 5A:
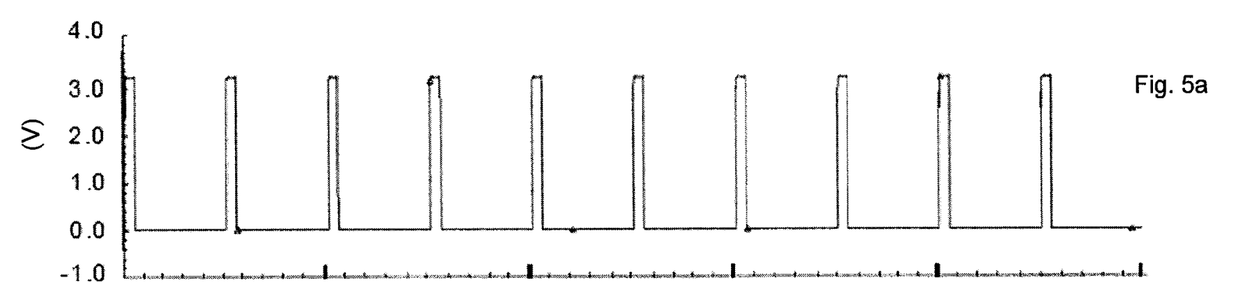
FIGS. 5a, 5b and 5c show one set of simulation results of the collector boost circuit 400 according to the present embodiment of the invention.
Figure 5B:
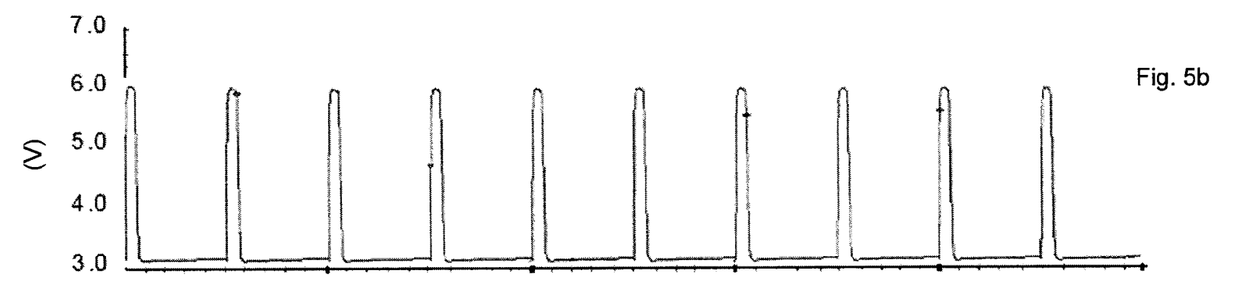
Figure 5C:
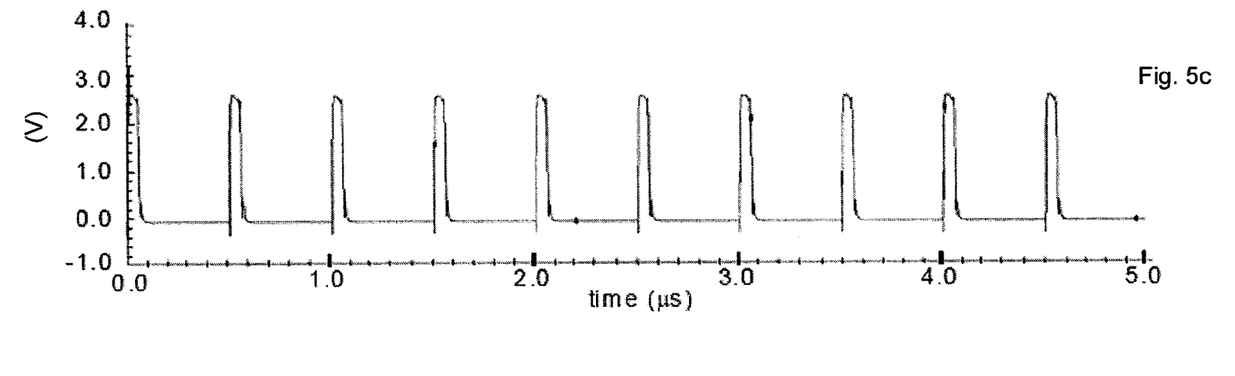

FIGS. 5a, 5b and 5c show one set of simulation results of the collector boost circuit 400 according to the present embodiment of the invention. FIG. 5a show the detector circuit 405 being triggered every 500 ns for a period of 50 ns. FIG. 5b shows the boosted output voltage 432 varying between 3.3 V to 6.6V. FIG. 5c illustrates the operation of the floating negative power rail 402, which provides power to the PFET clamp 408.

Figure 6:
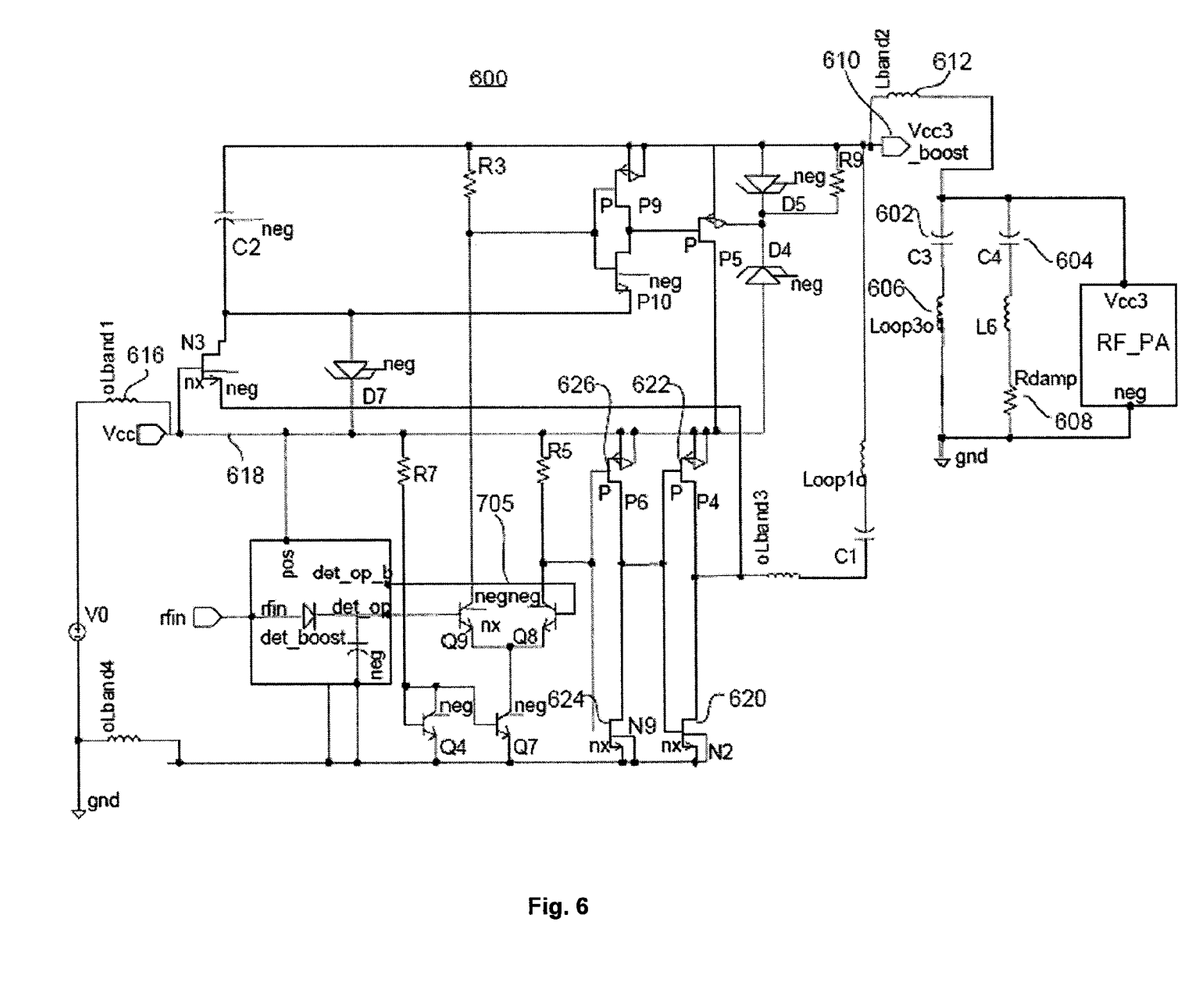
FIG. 6 illustrates the collector boost circuit connected to a load in the form of a PA and taking into account the load presented by the PA into the collector boost circuit and the effects of bondwire or interconnect inductance.

Referring to FIG. 6, shown is the collector boost circuit 600 connected to a load in the form of a PA and taking into account the load presented by the PA into the collector boost circuit and the effects of bondwire or interconnect inductance. Coupled to the boosted output voltage port 610 are a first bondwire inductance 612 and a first capacitor 602 coupled to an equivalent series inductance 606. Further coupled to the first capacitor 602 and the inductance 606 is a damping network having a second capacitor 604 and a damping resistor 608. Typically, a "ringing" of the bondwire inductances occurs when any transient event is fed through them to a capacitive load. The damping network across the boosted output voltage port 610 helps to control and prevent the ringing and the overshoot effect on a third stage of the PA. The value of the second capacitor 604 is selected such that it provides satisfactory transient response relatively free from ringing effects but with little or no increased losses during switching due to the damping network. Further damping is provided by using low 'on' resistance PFETs and adding ballasting resistors (not shown) at the source or drain of the PFET.

Figure 7:
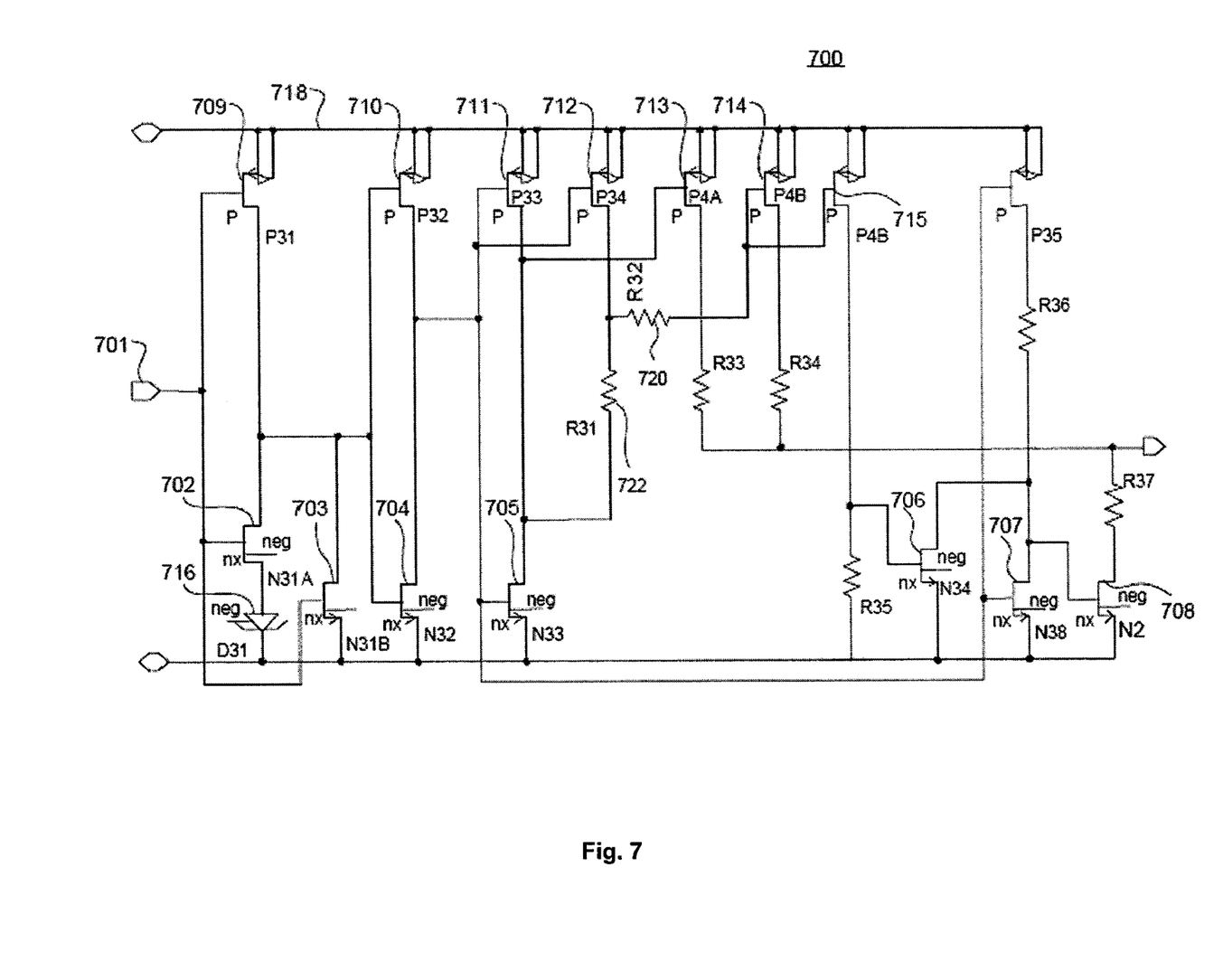
FIG. 7 illustrates a scheme for limiting the rate of change of current in the power PFET buffer.

Typically, the collector boost circuit on an integrated circuit needs to be protected from excessive voltages during switching. For example, if the collector boost circuit is turned off, the current supplied through a second bondwire inductance 616 to the Vcc power rail 618 is suddenly interrupted. If the rate of change is too significant then all the circuits wired to the Vcc power rail 618 are subject to overvoltage. Referring to FIG. 7 shown is a scheme for limiting the rate of change of current in the power PFET buffer 622 of FIG. 6 when it is switched off. The practical implementation of the transistors 620, 622, 624, and 626 shown in FIG. 6 is further illustrated in FIG. 7.

Referring to FIG. 7, charge pump buffer 700 comprises two additional stages of buffering according to an embodiment of the invention. The two additional stages of buffering provide improved efficiency and improved speed in transitioning from the low power class A drive provided by the bipolar transistor 429. The input port 701 has 2 NFET paths, where the first NFET 702 is wider than the second NFET 703. NFET 702 is source coupled to a Schottky diode 716 for offsetting its threshold and for compensating for the non-ideality of the drive from bipolar transistor 429, which is incapable of driving down to the negative rail 717. For example, the Schottky diode prevents a large standing current flowing in the first NFET 702 when an incomplete logic '0' drive is received from the bipolar transistor 429. In this case, the ballasting of the source of NFET 702 with the Schottky diode 716 provides a fast logic drive on its drain but provides an approximate drive down to the negative rail. With a logic '1' signal on the input port of the second NFET 703, a complete but slower pulldown is provided to the negative rail 717 but does not leak too much current when supplied with a poor logic '0' level.

Compared to FIG. 6, the charge pump buffer 700, has the output port of PFET 622 split in 2 major sections both with drain resistive ballasting. The first PFET 713 is driven as fast as possible and the second PFET 714 has slow down resistors in series with the gate. The switch 'on' is controlled through resistors 722 and 720. This slows the latter part of the turn on of the boost pulse so as to further minimise ringing. The switch 'off' is controlled via resistor 720 and this prevents the current in boost buffer collapsing immediately at turn off—thus minimising the subsequent overshoot on the positive power rail (pos) connected to the sources of P4.

Typically, CMOS buffers are not deigned to accommodate hazards when powering down since they drive a capacitive load with no standing DC. However, in this embodiment of the invention, there is a new susceptibility due to the DC, which is a collector boost problem.

The third section of the output PFET, the third PFET 715, is a small device mirroring the performance of the second PFET 714. It inhibits the turn on of transistor 708 until the current in 715 and 714 has ceased flowing. This prevents the wasteful condition of both FETs 714 and 708 being in conduction at the same time. NFET transistor 708 is further used to recharge the voltage boost capacitor 406 in FIG. 4.

Optionally, an RC series network is placed across the power rail (positive 718 to negative 717) in order to damp out any tendency of the power rail to ring with self capacitance of the PFETs and the bondwire. Due to the fact that the capacitances of the FETs are much reduced compared with the capacitance of the PA load capacitor, this damping network is does not use a large capacitor and is therefore integratable.

Figure 8:
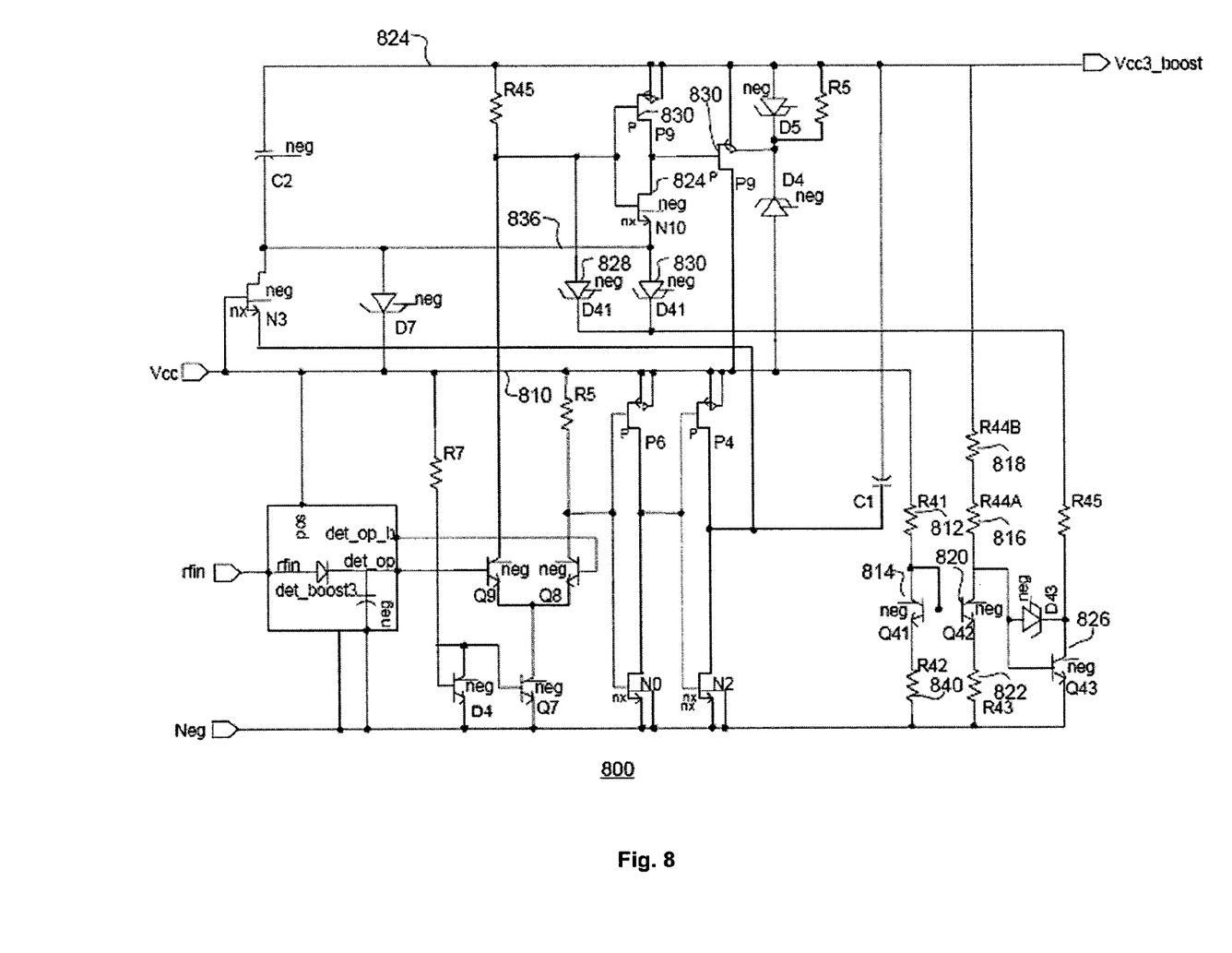
FIG. 8 illustrates another collector boost circuit according to an embodiment of the invention; and, FIGS. 9a, 9b, 9c illustrate simulation results for the collector boost circuit.

Optionally, another collector boost circuit 800 is shown in FIG. 8. The circuit 800 prevents the PFET clamp 808 from being switched on until the voltage on the PA has fallen close to the positive rail voltage 810. This prevents the charge injected into the capacitors 602 and 604 during boost from being shorted back through the positive rail 810 to the battery, which might cause the positive rail 810 to overvolt.

Here a mirror formed by resistor 812, 816, 818, 822, 840 and transistor 814, and 820 compares the potential on the positive rail 810 with the potential on the boosted output 824. If the boosted output 824 is significantly larger than the positive rail 810 then current flows in transistor 826 and this prevents the switch on of PFET clamp 808 until the mirror goes into equilibrium. Schottky diodes 828 and 830 prevent the voltage on the gates of PFET 832 and NFET 834 going below the float_neg power rail 836 which might otherwise damage them.

Figure 9A:
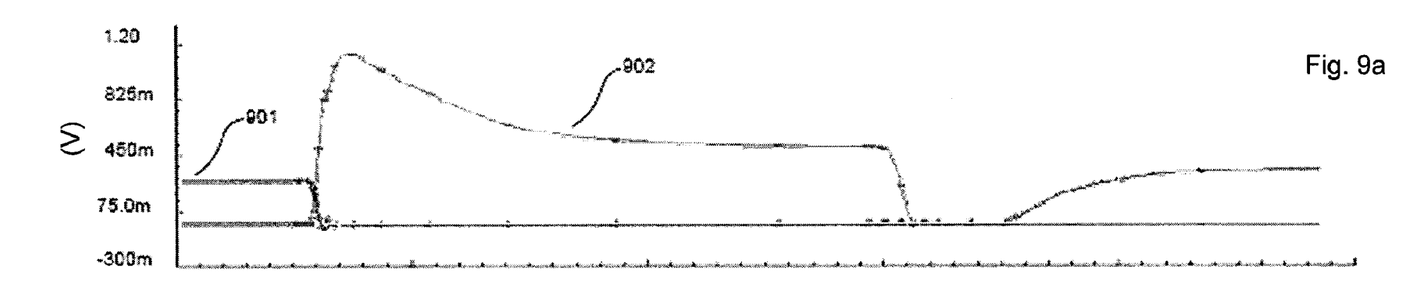
Figure 9B:
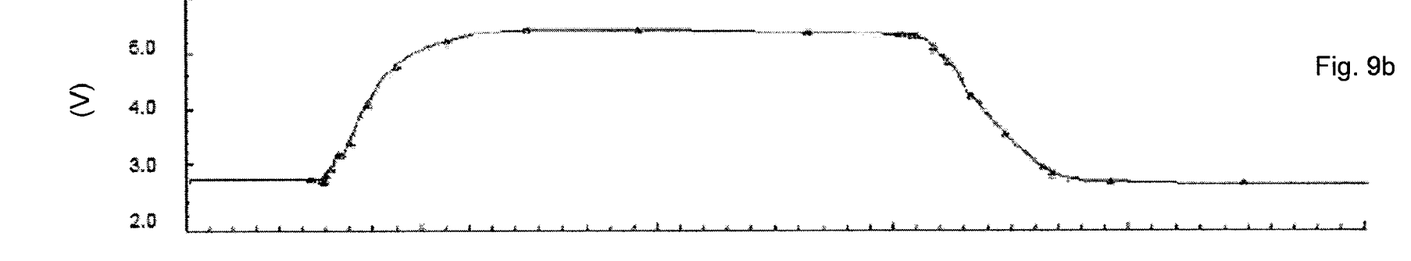
Figure 9C:
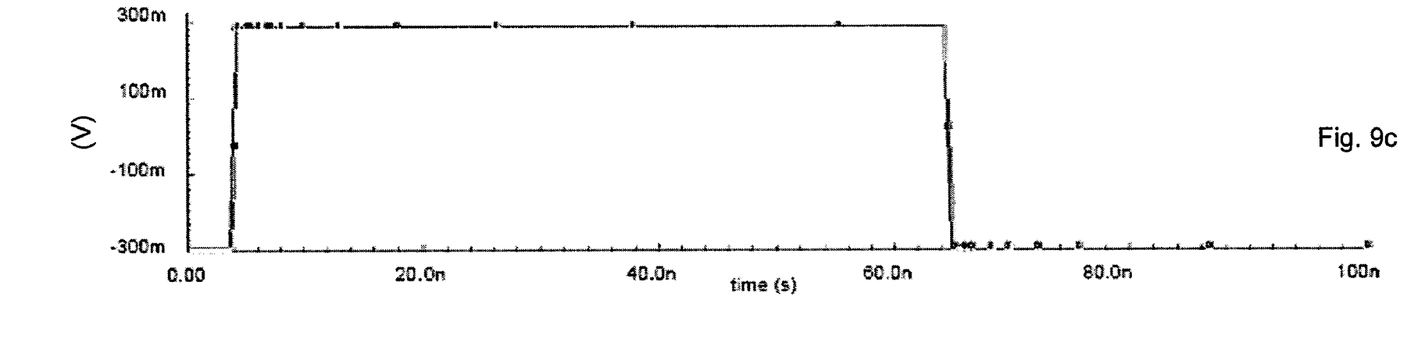

The overall waveforms for a practical boost circuit are simulated in FIGS. 9a, 9b and 9c. The simulation includes the effect of bondwires and PA loading. In this simulation example, the PA load is a 10 Ohm resistor (plus capacitor 602 at 1 nF and capacitor 604 at 2 nF with a 3 Ohm damping resistor 608).

The lowest trace in FIG. 9 simulates the drive from the detector. At t=10 ns a condition requiring voltage boost is sensed. The resulting boost voltage waveform is shown as centre trace. The two upper traces 901 and 902 show the current flowing in the 2 PFETs 422 and 408. The first trace

901 shows the current in PFET clamp 408, and before the boost a current flow of a little over 300 mA is observed. The second trace 902 shows the current in PFET 422. Note the huge current step needed to charge the first and the second capacitors 602 and 604 to the boost voltage. This current settles back to a steady 570 mA once 602 and 604 have been charged. At the end of the boost period the current in PFET 622 is switched off in a controlled manner as illustrated by the finite current slew rate in the timeframe 62 ns to 64 ns. In the period 64 ns to 72.5 ns the current to the PA is supplied from the first and the second capacitors 602 and 604 as they discharge. As the boost voltage approaches the voltage on the positive supply rail, PFET clamp 408 starts to conduct. Its current rises significantly above 300 mA since NFET 444 also conducts so as to recharge the boost capacitor C1 ready for the next period of boost.

The present invention increases the collector voltage on an amplifying transistor of a stage of a power amplifier for a brief interval. The increased collector voltage provides higher peak power during a peak pulse in the incoming signal. The collector is biased with a lower collector voltage than normal and this technique is used to respond to peaks in the OFDM signal. The lower collector voltage that is quiescent allows a reduction in power consumption. In order to properly provide an undistorted output signal, the collector voltage must be increased at the correct time without delay relative to the RF signal and for at least the correct duration. The increase in the collector voltage during the period of the peak pulse allows an amplified signal with less distortion than that provided with the normal collector voltage.

Alternatively, the boost buffers are supplied with a different supply voltage than the Vcc voltage supplied to the PA thereby allowing a wider voltage range to be supplied to the boost buffers.

Alternatively, FET transistors are used in place of the BJT transistors described hereinabove.

Advantageously, the present invention as described supports complete integration allowing for low cost implementation thereof.

Numerous other embodiments may be envisioned without departing from the spirit or scope of the invention.

What is claimed is:

1. A circuit comprising:
   a boost capacitor;
   an amplifier voltage supply output port;
   a voltage supply input port for receiving a first voltage;
   an indicator signal input port for receiving an indicator signal;
   at least a switch responsive to the indicator signal for switching between a first mode of operation and a second other mode of operation, where in the first mode of operation, the at least a switch for charging of the boost capacitor and for providing the first voltage to the amplifier voltage supply output port and in the second mode of operation, the at least a switch for providing a boost voltage at the amplifier voltage supply output port in excess of the first voltage, the boost voltage resulting from a cooperation of the boost capacitor and the first voltage;
   an amplifying transistor having a base, an emitter and a collector, wherein the amplifying transistor is coupled for receiving a supply voltage from the amplifier voltage supply output port; and
   an RF signal input port for receiving an RF signal and coupled with the amplifying transistor for amplifying of said received RF signal.

2. A circuit according to claim 1, wherein the switch circuit consists of FETs, capacitors, and resistors.

3. A circuit according to claim 1, wherein the amplifying transistor is biased for class B operation.

4. A circuit according to claim 1, comprising:
   an RF signal output port for providing of an amplified RF signal therefrom; and,
   a sensing circuit that, in use, senses an amplitude of the amplified RF signal at the RF signal output port and for providing the indicator signal in dependence thereon.

5. A circuit according to claim 4, wherein the sensing circuit, in use, senses a first voltage of a voltage source coupled to the voltage supply input port and provides the indicator signal in dependence upon the first voltage, the indicator signal for controlling a trigger point at which switching occurs between the first mode and second mode of operation and continuously varied in dependence upon the first voltage.

6. A circuit according to claim 4, wherein the sensing circuit, in use, senses a temperature of the circuit and provides the indicator signal in dependence upon the temperature, the indicator signal for controlling a trigger point at which switching occurs between the first mode and second mode of operation and continuously varied in dependence upon the temperature.

7. A circuit according to claim 4, wherein the RF signal is an OFDM RF signal.

8. A circuit according to claim 1, comprising a damping network for damping of transient response resulting from switching of the voltage on the amplifier voltage supply output port.

9. A circuit according to claim 8, wherein the damping network is integrated within a same integrated circuit.

10. A circuit according to claim 9, for driving a load having a capacitance and wherein the damping network comprises a capacitor and a damping resistor, the capacitor having a small capacitance compared to the capacitance of the load.

11. A circuit according to claim 10, comprising a power buffer including FETs coupled for charging the boost capacitor, capacitances of the FETs within the power buffer are substantially lower that the capacitance of the load.

12. A circuit comprising:
    a boost capacitor;
    an amplifier voltage supply output port;
    a voltage supply input port for receiving a first voltage;
    an indicator signal input port for receiving an indicator signal;
    at least a switch responsive to the indicator signal for switching between a first mode of operation and a second other mode of operation, where in the first mode of operation, the at least a switch for charging of the boost capacitor and for providing the first voltage to the amplifier voltage supply output port and in the second mode of operation, the at least a switch for providing a boost voltage at the amplifier voltage supply output port in excess of the first voltage, the boost voltage resulting from a cooperation of the boost capacitor and the first voltage; and
    a PFET clamp having at least a diode biasing a bulk thereof, the PFET clamp coupled between a voltage source coupled to the voltage supply input port and the amplifier voltage supply output port, the PFET clamp for supporting, in the second mode of operation, the voltage provided to the amplifying transistor in excess of the first voltage.

13. A circuit according to claim 12, wherein the voltage source consists of a single voltage rail at Vcc.

14. A circuit according to claim 12, wherein the at least a diode comprises a Schottky diode coupled between a drain of the PFET clamp and a bulk thereof.

15. A circuit according to claim 14, wherein the at least a diode comprises a Schottky diode coupled between a source of the PFET clamp and a bulk thereof.

16. A circuit according to claim 15, comprising a resistor coupled between the source of the PFET clamp and a bulk thereof.

17. A circuit according to claim 16, integrated onto a same substrate.

18. A circuit according to claim 12, wherein the at least a diode comprises a Schottky diode coupled between the drain of the PFET clamp and a bulk thereof.

19. A circuit according to claim 18, comprising a resistor coupled between the source of the PFET clamp and a bulk thereof.

20. A circuit comprising:
a boost capacitor;
an amplifier voltage supply output port;
a voltage supply input port for receiving a first voltage;
an indicator signal input port for receiving an indicator signal;
at least a switch responsive to the indicator signal for switching between a first mode of operation and a second other mode of operation, where in the first mode of operation, the at least a switch for charging of the boost capacitor and for providing the first voltage to the amplifier voltage supply output port and in the second mode of operation, the at least a switch for providing a boost voltage at the amplifier voltage supply output port in excess of the first voltage, the boost voltage resulting from a cooperation of the boost capacitor and the first voltage;
a PFET clamp coupled between the voltage supply input port and a amplifier voltage supply output port, the PFET clamp for supporting, in the second mode of operation, the voltage provided to the amplifying transistor in excess of the first voltage; and
a gate of the PFET clamp driven by a boost buffer coupled between the amplifier voltage supply output port and a floating potential, the floating potential for providing an approximately consistent voltage drop across the boost buffer.

21. A circuit according to claim 20, wherein the boost buffer is disposed for receiving the indicator signal and for providing a signal based on the indicator signal for changing from the first mode to the second mode.

22. A circuit according to claim 20, comprising a floating power rail capacitor disposed between the floating potential and the amplifier voltage supply output port and coupled to the boost buffer.

23. A circuit according to claim 22, wherein the floating power rail capacitor is set to approximately 4 to 5 times a gate capacitance of the PFET clamp.

24. A circuit according to claim 23 integrated onto a same substrate.

25. A circuit according to claim 21, wherein the boost buffer comprises a voltage level conversion circuit for driving CMOS logic therefrom.

26. A circuit according to claim 25, wherein the voltage conversion circuit comprises a bipolar differential pair for providing an antiphase and level shifted signal and for driving the boost buffer to drive the PFET clamp.

27. A circuit comprising:
a boost capacitor;
an amplifier voltage supply output port;
a voltage supply input port for receiving a first voltage;
an indicator signal input port for receiving an indicator signal;
at least a switch responsive to the indicator signal for switching between a first mode of operation and a second other mode of operation, where in the first mode of operation, the at least a switch for charging of the boost capacitor and for providing the first voltage to the amplifier voltage supply output port and in the second mode of operation, the at least a switch for providing a boost voltage at the amplifier voltage supply output port in excess of the first voltage, the boost voltage resulting from a cooperation of the boost capacitor and the first voltage;
a PFET clamp; and,
a controller for preventing the switch on of the PFET clamp until the capacitor is at least partially discharged.

28. A circuit according to claim 27, wherein the controller comprises a mirror circuit for comparing the potential of the amplifier voltage supply output port with the potential on the voltage supply and for preventing the switch on of the PFET clamp until the mirror reaches equilibrium.

29. A circuit according to claim 27, wherein the controller, in use, prevents switching of the PFET clamp until the capacitor is mostly discharged.

30. A circuit according to claim 26, wherein the power buffer comprises a plurality of PFETs each for providing a current path to the power buffer output port and for being switched at different times, the different times offset from one another to limit a rate of change of current within the power buffer.

31. A circuit according to claim 26, wherein the power buffer comprises a plurality of PFETs each for providing a current path to the power buffer output port and for being switched at different times, the different times offset from one another to limit overvoltage within the circuit.

32. A method of improving linearity of a power amplifier comprising:
amplifying an RF signal to provide an amplified RF signal comprising:
providing an amplifier circuit including an amplifier voltage input port;
providing a PFET clamp transistor having parasitic PNP transistors,
biasing a bulk of the PFET clamp transistor using at least a Schottky diode;
conducting the at least a Schottky diode before the parasitic PNP transistors of the PFET clamp turn on; and,
discharging the bulk of the PFET clamp using a resistor;
in a first mode of operation, providing a first voltage potential to the amplifier voltage input port;
in a second other mode of operation, providing a boosted voltage potential to the amplifier voltage input port, the boosted voltage potential formed by summing a first voltage potential from a voltage supply and a second voltage potential stored within a capacitor; and,
switching from the first mode to the second mode in dependence upon a detected a presence of a peak pulse within the RF signal.

33. A method according to claim 32, comprising:
providing the RF signal to the amplifier circuit;
providing an indication of a presence of a peak pulse within the RF signal;
during a duration of the indicated peak pulse, maintaining the second other mode of operation.

34. A method according to claim 33, wherein providing the RF signal comprises providing an OFDM RF signal.

35. A method according to claim 32, wherein the boosted voltage is approximately twice the first voltage.

36. A method according to claim 32, wherein the peak pulse is detected at an output of the amplifier circuit.

37. A method according to claim 32, comprising:
providing a floating potential for in combination with the boosted voltage driving the PFET clamp transistor; and,
tracking the voltage of the boosted voltage with the floating potential to result in an approximately constant voltage potential therebetween.

38. A method according to claim 32, comprising:
providing a sensing circuit having an output port;
shifting the level of an output signal provided from the output port of the sensing circuit to CMOS levels and providing an antiphase signal level shifted to drive a boost buffer driving the PFET clamp transistor.

39. A method according to claim 32, wherein switching from the first mode to the second mode occurs at a detected peak voltage, the detected peak voltage below a voltage at which an overload of the amplifier circuit and clipping of the amplified RF signal will result.

40. A method according to claim 39, wherein the detected peak voltage is substantially below the voltage at which clipping will result to prevent distortion in the amplified RF signal, the voltage selected to result in few unnecessary switches from the first mode to the second mode.

41. A method of improving linearity of a power amplifier comprising:
amplifying an RF signal to provide an amplified RF signal comprising:
providing an amplifier circuit including an amplifier voltage input port;
in a first mode of operation, providing a first voltage potential to the amplifier voltage input port;
in a second other mode of operation, providing a boosted voltage potential to the amplifier voltage input port, the boosted voltage potential farmed by summing a first voltage potential from a voltage supply and a second voltage potential stored within a capacitor;
switching from the first mode to the second mode in dependence upon a detected presence of a peak pulse within the RF signal;
wherein in both the first and second modes of operation, a voltage potential across a boost buffer is approximately same, but wherein a voltage potential from a negative rails to each of the potentials is different.

42. A method of improving linearity of a power amplifier comprising:
amplifying an RF signal to provide an amplified RF signal comprising:
providing an amplifier circuit including an amplifier voltage input port;
in a first mode of operation, providing a first voltage potential to the amplifier voltage input port;
in a second other mode of operation, providing a boosted voltage potential to the amplifier voltage input port, the boosted voltage potential formed by summing a first voltage potential from a voltage supply and a second voltage potential stored within a capacitor; and,
switching from the first mode to the second mode in dependence upon a detected a presence of a peak pulse within the RF signal;
wherein a trigger point of switching from the first mode to the second mode is continuously varied in further dependence upon a temperature of the amplifier circuit.

43. A method of improving linearity of a power amplifier comprising:
amplifying an RF signal to provide an amplified RF signal comprising:
providing an amplifier circuit including an amplifier voltage input port;
in a first mode of operation, providing a first voltage potential to the amplifier voltage input port;
in a second other mode of operation, providing a boosted voltage potential to the amplifier voltage input port, the boosted voltage potential formed by summing a first voltage potential from a voltage supply and a second voltage potential stored within a capacitor;
switching from the first mode to the second mode in dependence upon a detected a presence of a peak pulse within the RF signal;
wherein in the first mode of operation, the capacitor is charged by a charging circuit and in the second mode of operation the capacitor is discharged, switching from the second mode of operation to the first mode of operation performed in stages to avoid at least one of transients within the boosted voltage and transients in the internal circuits of the integrated implementation.

44. A method of improving linearity of a power amplifier comprising:
amplifying an RF signal to provide an amplified RF signal comprising:
providing an amplifier circuit including an amplifier voltage input port;
in a first mode of operation, providing a first voltage potential to the amplifier voltage input port;
in a second other mode of operation, providing a boosted voltage potential to the amplifier voltage input port, the boosted voltage potential formed by summing a first voltage potential from a voltage supply and a second voltage potential stored within a capacitor;
switching from the first mode to the second mode in dependence upon a detected a presence of a peak pulse within the RF signal;
wherein in the first mode of operation the capacitor is charged by a charging circuit and in the second mode of operation the capacitor is discharged, switching from the first mode of operation to the second mode of operation performed in stages to avoid transients within the boosted voltage and transients in the internal circuits of the integrated implementation.

45. A method according to claim 32, wherein in the first mode of operation the capacitor is charged by a charging circuit and in the second mode of operation the capacitor is discharged, switching from the second mode of operation to the first mode of operation performed upon substantial discharge of the capacitor.

46. A storage medium having stored therein data, the data for when executed resulting in an amplifier design comprising:

a boost capacitor;

an amplifier voltage supply output port;

a voltage supply input port for receiving a first supply voltage;

an indicator signal input port for receiving an indicator signal;

at least a switch responsive to the indicator signal for switching between a first mode of operation and a second other mode of operation, where in the first mode of operation. the at least a switch for charging of the boost capacitor and for providing the first voltage to the amplifier voltage supply output port and in the second mode of operation, the at least a switch for providing a boost voltage at the amplifier voltage supply output port in excess of the first voltage, the boost voltage resulting from a cooperation of the boost capacitor and the first voltage; and an amplifying transistor having a base, an emitter and a collector, wherein the amplifying transistor is coupled for receiving a supply voltage from the amplifier voltage supply output port.

* * * * *